United States Patent [19]
Kestler

[11] Patent Number: 4,721,915
[45] Date of Patent: Jan. 26, 1988

[54] HIGH FREQUENCY ANTENNA SYSTEM FOR NUCLEAR MAGNETIC RESONANCE TOMOGRAPHY DEVICES

[75] Inventor: Joachim Kestler, Pretzfeld, Fed. Rep. of Germany

[73] Assignee: Siemens Aktiengesellschaft, Berlin and Munich, Fed. Rep. of Germany

[21] Appl. No.: 824,464

[22] Filed: Jan. 31, 1986

[30] Foreign Application Priority Data

Mar. 6, 1985 [DE] Fed. Rep. of Germany ....... 3507946

[51] Int. Cl.$^4$ ........................................... G01R 33/20
[52] U.S. Cl. ................................. 324/322; 324/318
[58] Field of Search .............. 324/314, 318, 300, 319, 324/321, 322, 320, 316; 335/299; 333/219

[56] References Cited

U.S. PATENT DOCUMENTS

| 4,517,516 | 5/1985 | Hill | 324/318 |
| 4,563,648 | 1/1986 | Hill | 324/318 |
| 4,594,566 | 6/1986 | Maudsley | 324/318 |
| 4,607,225 | 8/1986 | Crooks | 324/318 |
| 4,616,181 | 10/1986 | Kemner | 324/318 |
| 4,638,253 | 1/1987 | Jaskolski | 324/318 |
| 4,641,098 | 2/1987 | Doty | 324/318 |

FOREIGN PATENT DOCUMENTS 0073375 3/1984 European Pat. Off. .
3133432 2/1983 Fed. Rep. of Germany .
2530816 7/1982 France .

OTHER PUBLICATIONS

"Slotted Tube Resonator: A New NMR Probe Head at High Observing Frequencies," Schneider et al, Rev. Sci. Instrum., vol. 48, No. 1, Jan. 1977.

Primary Examiner—Michael J. Tokar
Attorney, Agent, or Firm—Hill, Van Santen, Steadman & Simpson

[57] ABSTRACT

A high frequency antenna system for nuclear magnetic resonance tomography devices generates a substantially uniform magnetic high frequency field and receives high frequency signals, and includes two conductor members supplied with current of opposite polarity, the conductor members being of a selected length and extending along an imaginary cylinder parallel to the direction of the cylinder axis. Electrodes are provided at the end regions of the conductor members, the electrodes maintaining the electrical field generated at the ends of the current-supplied conductor members away from the examination chamber, and limiting the magnetic high-frequency field generated by the current-supplied conductor members substantially to the examination chamber between the electrodes.

9 Claims, 4 Drawing Figures

HIGH FREQUENCY ANTENNA SYSTEM FOR NUCLEAR MAGNETIC RESONANCE TOMOGRAPHY DEVICES

BACKGROUND OF THE INVENTION

1. Field of the Invention

The present invention relates to a high-frequency antenna system for use in a nuclear magnetic resonance tomography device, and in particular to such an antenna system for generating and/or receiving high-frequency signals.

2. Description of the Prior Art

High-frequency antenna systems for generating and/or receiving high frequency signals in a nuclear magnetic resonance tomography device are known in the art including at least two conductor members which are supplied with current of opposite polarity and being of a predetermined length extending on an imaginary cylindrical generated surface parallel to the direction of the cylinder axis. Such an antenna arrangement is described, for example, in German OS No. 31 33 432 in combination with an additional envelope. The structure and use of the additional envelope plays no part in the subject matter of the present invention.

In supra-conductive whole-body magnets having field strengths of the basic field in the range of from about 0.5 through about 2.0T, the nuclear resonance frequencies for protons are in the range from about 20 through about 85 MHz. The magnetic high-frequency fields required for such devices can only be imperfectly generated at this frequency range with pure inductances (coils), because the wavelength becomes increasingly closer to the conductor length of the coils with increasing frequency. Phase shifts of the fields thereby result, between the beginning of the conductor and the end of the conductor of the coils. These phase shifts correspondingly reduce the functionability of the coil generating the high-frequency field. For this reason, in conventional devices, resonators are used for generating the magnetic high-frequency field. Such resonators, in the simplest case, are formed by the aforementioned two parallel oppositely supplied conductor members.

Line resonators for the given range are suggested, for example, by H. J. Schneider and P. Dullenkopf in "Review Of Scientific Instruments," Vol. 48, 68 (1977) and in the aforementioned German OS No. 31 33 432. In all cases, however, an electric field is present at the ends of the resonators described therein, this electric field penetrating the subject being examined and therefore resulting in undesired dielectric losses which deteriorate the signal-to-noise ratio, and thereby require higher high-frequency power. Moreover, the magnetic field is not limited to the examination chamber but extends far beyond the ends of the resonator, this also resulting in undesired losses and potentially resulting in noise signals from undesired regions during imaging.

SUMMARY OF THE INVENTION

It is an object of the present invention to provide a high-frequency antenna system for a nuclear magnetic resonance tomography device, wherein a uniform magnetic high-frequency field is present within a specified measuring volume substantially free of electrical high-frequency fields.

It is a further object of the present invention to provide such a high-frequency antenna system for a nuclear magnetic resonance tomography device, wherein the magnetic high-frequency field is substantially reduced outside of the measuring volume, i.e., the magnetic high-frequency field is substantially contained within the measuring volume.

The above objects are inventively achieved in accordance with the principles of the present invention in an antenna system wherein electrodes are provided at the end regions of the conductor members, these electrodes substantially maintaining the electrical field which arises at the ends of the current-supplied conductor members away from the examination chamber, and further limiting the magnetic high-frequency field generated by the current-supplied conductor members essentially to the examination chamber between the electrodes. The undesired magnetic field outside of the examination chamber is noticeably reduced by the electrodes in comparison with conventional resonators. The electrodes also embody the terminating capacitances required for resonance. If the electrodes are moveably mounted, the resonant frequency of the arrangement can be varied within relatively broad limits (for example, 60 through 105 MHz) by shifting the position of the electrodes in a direction parallel to the direction of the conductor members.

The use of additional conductor members of band-like conductor cross-sections can further improve the homogeneity of the magnetic high-frequency field in the arrangement in accordance with the principles of the present invention.

The system disclosed herein may also be used for circular polarization by adding a second pair of waveguides offset parallel to the first pair, and further offset by an angle $\alpha$ around the cylinder axis. Given an exactly dynamically balanced structure ($\alpha=90°$), nothing is changed with respect to the current distribution within the two halves of the device, so that no electrical coupling occurs. Both resonator systems are tuned by shifting the common electrodes. Additional fine balance may be provided by metal strips functioning as a trimming capacitance in order, for example, to compensate for deviations in the resonant frequencies caused by manufacturing tolerances.

DESCRIPTION OF THE PREFERRED EMBODIMENTS

Figure 2:
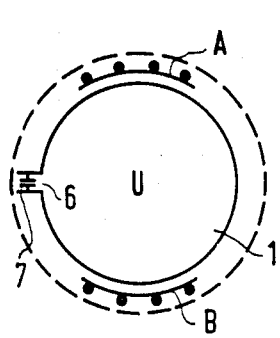
FIG. 2 is an end view of the antenna system shown in FIG. 1.
Figure 1:
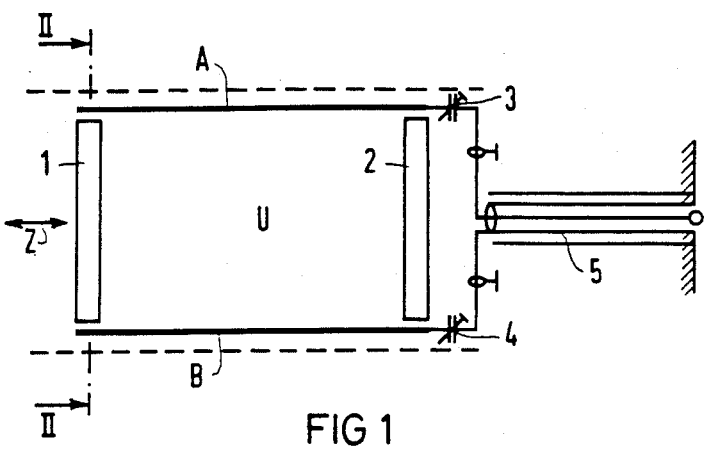
FIG. 1 is a side view in section of a high-frequency antenna system for a nuclear magnetic resonance tomography device constructed in accordance with the principles of the present invention.

As shown in FIGS. 1 and 2, the examination chamber U of a nuclear magnetic resonance tomography device is enclosed by rod systems A and B, each of which has four conductor members disposed on an imaginary cylinder and extending parallel to the cylinder axis. The direction of the imaginary cylinder axis and of the extend of the conductor members, will be referred to as the Z-direction herein. Annular electrodes 1 and 2 consisting of metal, preferably in the form of metal tapes, are disposed at a distance from the rod systems A and B coaxially with respect to the cylinder axis.

Various alternatives such as, for example, inductive coupling, are available for adapting the resonator to a 50 ohm line. A circuit which has been demonstrated to work acceptably in practice is shown in FIG. 1. Variable coupling capacitors 3 and 4 are disposed so as to permit the resonator to be exactly matched both in a no-load operation (for example during phantom tests) as well as under a patient load condition. The shift of the resonant frequency thereby appearing can easily be compensated by readjusting one of the electrodes 1 or 2. The arrangement is fed symmetrically with respect to ground in order to avoid disturbing the electrical symmetry of the resonant circuit. A $\lambda/4$ detuning sleeve 5, also known as a Lindenblad pot, serves this purpose.

A further view of the system shown in FIG. 1 taken along line II—II is shown in FIG. 2.

In order to prevent eddy currents from disturbing the gradient fields necessary for imaging in the nuclear magnetic resonance tomography device, the electrodes 1 and 2 of metal tape such as, for example, copper, are interrupted at a location 6. The interruptions at 6 are suppressed by connecting suitable fixed capacitors 7 for high-frequency currents.

Figure 3:
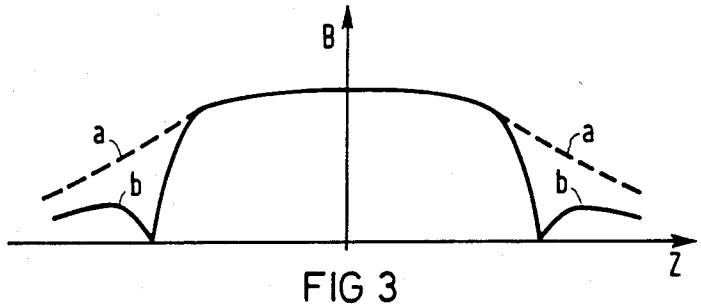
FIG. 3 is a curve of the magnetic field strength along the Z-axis for the arrangement shown in FIGS. 1 and 2.

The curve for the high-frequency magnetic field B with respect to the Z-axis in the device shown in FIGS. 1 and 2 is shown in FIG. 3. Compared to conventional resonators as indicated by curve a, the undesired outer field is noticeably reduced, as indicated by the portions of the curve referenced at b, by the ring capacitors in the present arrangement.

Figure 4:
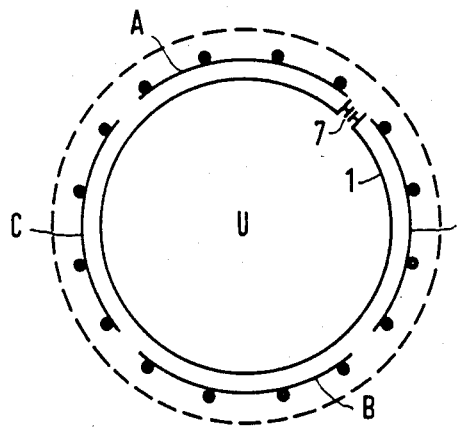
FIG. 4 is a further embodiment of a high-frequency antenna system constructed in accordance with the principles of the present invention for circular polarization.

A further embodiment of the arrangement disclosed herein is shown in FIG. 4 for circular polarization of the high-frequency field. A second added rod system pair C and D is disposed on the same cylinder as the first pair A and B, but is rotated by 90° with respect to the cylinder axis in comparison to the system formed by the A and B.

All of the embodiments discussed above are suitable both for exciting nuclear resonance and for reception of nuclear resonance signals emitted by the examination subject.

Although modifications and changes may be suggested by those skilled in the art it is the intention of the inventor to embody within the patent warranted hereon all changes and modificatons as reasonably and properly come within the scope of their contribution to the art.

I claim as my invention:

1. A high-frequency antenna system for use in a nuclear magnetic resonance tomography device having a longitudinally extending examination chamber and an RF transmitter, said system comprising:

at least two isolated members supplied with high-frequency current of opposite polarity by said RF transmitter to generate a magnetic high-frequency field, said conductor members having a predetermined length and surrounding said examination chamber on an imaginary cylindrical surface, said conductor members extending parallel to a longitudinal axis of said cylindrical surface and each conductor member terminating in opposite ends; and an electrode disposed at each end of each conductor member for maintaining the elcetrical field generated at the respective ends of said conductor members away from said examination chamber and limiting said magnetic high-frequency field substantially to said examination chamber between said electrodes.

2. A high-frequency antenna system as claimed in claim 1, wherein said electrodes are moveably mounted.

3. A high-frequency antenna system as claimed in claim 2, wherein said electrodes are displaceable along said longitudinal axis.

4. A high-frequency antenna system as claimed in claim 1, wherein said electrodes are annular rings surrounding said examination chamber.

5. A high-frequency antenna system as claimed in claim 4, wherein said annular rings are electrically interrupted at a location thereon.

6. A high-frequency antenna system as claimed in claim 5, wherein said interruption in each electrode is bridged by a capacitor.

7. A high-frequency antenna system as claimed in claim 4, wherein said annular rings are formed by metal tape.

8. A high-frequency antenna system as claimed in claim 4, wherein said tape consists of copper.

9. A high-frequency antenna system as claimed in claim 1, comprising four of said conductor members disposed equidistantly around said cylindrical surface in order to achieve a circularly polarized field, said conductor members being divided into two pairs, and each conductor member in each pair being supplied with current of opposite polarity with respect to the other conductor member in said pair.

* * * * *